(12) United States Patent
Yin et al.

(10) Patent No.: US 8,633,081 B2
(45) Date of Patent: Jan. 21, 2014

(54) MODIFYING GROWTH RATE OF A DEVICE LAYER

(75) Inventors: Chunshan Yin, Singapore (SG); Palanivel Balasubramaniam, Singapore (SG); Jae Gon Lee, Singapore (SG); Elgin Quek, Sinagpore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 452 days.

(21) Appl. No.: 12/980,376

(22) Filed: Dec. 29, 2010

(65) Prior Publication Data

US 2012/0168895 A1 Jul. 5, 2012

(51) Int. Cl.
*H01L 21/336* (2006.01)

(52) U.S. Cl.
USPC .......................................... 438/289; 438/294

(58) Field of Classification Search
USPC ................... 438/218–228, 287–307, E21.409
See application file for complete search history.

(56) References Cited

U.S. PATENT DOCUMENTS

2012/0032278 A1* 2/2012 Kammler et al. ............. 438/300

* cited by examiner

*Primary Examiner* — Cuong Q Nguyen
(74) *Attorney, Agent, or Firm* — Horizon IP Pte. Ltd.

(57) ABSTRACT

A device includes a substrate with a device region on which a transistor is formed. The device region includes active edge regions and an active center region which have different oxidation growth rates. A growth rate modifier (GRM) comprising dopants which modifies oxidation growth rate is employed to produce a gate oxide layer which has a uniform thickness. The GRM may enhance or retard the oxidation growth, depending on the type of dopants used. Fluorine dopants enhance oxidation growth rate while nitrogen dopants retard oxidation growth rate.

21 Claims, 25 Drawing Sheets

US 8,633,081 B2

MODIFYING GROWTH RATE OF A DEVICE LAYER

BACKGROUND

A transistor includes a gate with a gate electrode layer over a gate dielectric layer. Current processes used in forming transistors have been found to produce gate oxides having non-uniform thicknesses. In particular, gate oxide thinning occurs at or near the edge of a shallow trench isolation (STI).

As device dimensions continue to become smaller, thinning of the gate oxide at the STI edge accentuates narrow-channel-effect. For example, changes in the gate threshold voltage ($V_t$) occurs. This negatively impacts performance and reliability, such as TDDB failures.

From the foregoing discussion, it is desirable to provide more uniform oxide layers to improve, for example, device performance and reliability.

SUMMARY

A method for forming a semiconductor device is disclosed. The method includes providing a substrate with a device region having first and second regions. The first region includes a first intrinsic growth rate for a device layer and the second region includes a second intrinsic growth rate for the device layer. The method further includes forming a growth rate modifier (GRM) in the first region of the substrate. The GRM modifies the first intrinsic growth rate to a first modified growth rate. The device layer is formed on the substrate. The device layer has the first modified growth rate in the first region and the second intrinsic growth rate in the second region of the substrate.

In one embodiment, a method for forming a semiconductor device is presented. The method includes providing a substrate with an active device region surrounded by an isolation region. The device region has active edge regions and an active center region. The active edge region has a first intrinsic oxidation growth rate and the active center region has a second intrinsic oxidation growth rate which is faster than the first intrinsic oxidation growth rate. The method further includes forming a first growth rate modifier (GRM) in either the active edge regions or the active center region to modify the first intrinsic oxidation growth rate or second intrinsic oxidation growth rate to produce a modified first oxidation growth rate or a second modified oxidation growth rate. An oxygen containing layer is formed by thermal oxidation.

In another embodiment, a device having a substrate with a device region surrounded by an isolation region is disclosed. The device region has active edge portions and an active center portion. The active edge portions include a first intrinsic oxidation growth rate and the active center portion includes a second intrinsic oxidation growth rate. A GRM is disposed in the device region in the active edge regions or active center region to modify the first or second intrinsic oxidation growth rates. The device further includes a thermally oxidized layer disposed on the device region. The thermally oxidized layer comprises a uniform thickness due to the GRM.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Embodiments will now be described, by way of example with reference to the drawings of which.

DETAILED DESCRIPTION

Embodiments generally relate to semiconductor devices. Some embodiments relate to devices having uniform gate oxide thickness. Such devices, for example, can be incorporated into standalone devices or ICs, such as microcontrollers or system on chips (SoCs). The devices or ICs can be incorporated into or used with, for example, electronic products, computers, cell phones, and personal digital assistants (PDAs). The devices may also be incorporated into other types of products.

Figure 1A:
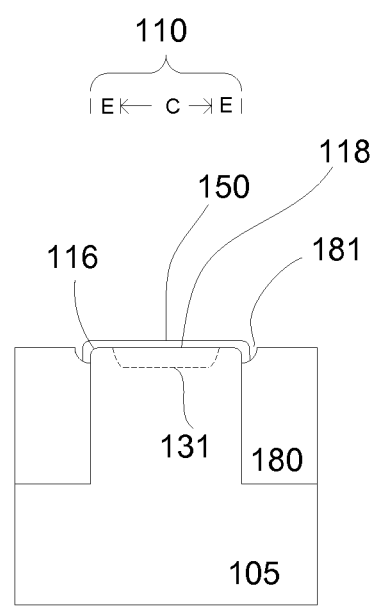
FIGS. 1a-c show various embodiments of a device.
Figure 1B:
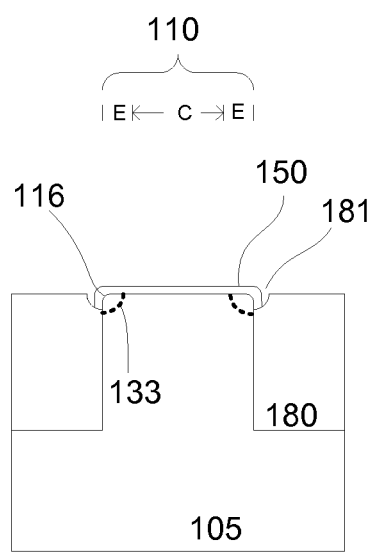
Figure 1C:
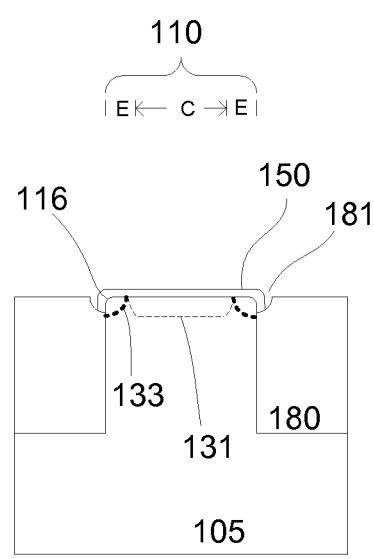

FIGS. 1a-c show cross-sectional views of various embodiments of a portion of a device 100. Referring to FIG. 1a, a substrate 105 is shown. The substrate, for example, is a semiconductor substrate, such as a silicon substrate. In one embodiment, the substrate comprises a p-type doped substrate. For example, the p-type doped substrate is a lightly doped p-type substrate. Other types of semiconductor substrates, including those which are undoped or doped with the same or different types of dopants, such as silicon on insulator (SOI), silicon germanium, or gallium, may also be useful.

In one embodiment, the substrate includes a device region 110. The device region, for example, is surrounded by an isolation region 180. The isolation region separates the device region from other device regions on the substrate (not shown). The isolation region, for example, is a shallow trench isolation (STI) region. Other types of isolation regions may also be employed. The STI region, for example, extends to a depth of about 300 nm. Providing STI regions which extend to other depths may also be useful.

The device region serves as an active device region for a transistor (not shown). A doped well (not shown) may be provided in the device region for the transistor. The doped well, for example, may extend below the STI region. For example, the doped well extends to about 600 nm deep. The doped well may have a second polarity type dopant for a first polarity type transistor. For example, a p-type doped well is for an n-type transistor. The dopant concentration of the doped well, for example, may be about 1e17/cm$^3$. Other parameters for the doped well may also be useful.

The substrate may include other device regions. The device regions may be for other types of devices, including both p-type and n-type devices. For example, the IC may include logic regions in which logic devices are formed. Depending on the type of IC formed, the logic regions, for example, may include regions for different voltage devices. For example, the logic regions may include regions for high voltage (HV) devices, medium or intermediate voltage (IV) devices and low voltage (LV) devices. Other configurations of logic regions may also be useful. Additionally, other types of device regions may also be provided. For example, an array region may be provided for memory cells.

In one embodiment, the device region may include portions which have different growth rate of a device layer formed therein. The different portions having different device layer growth rates may result in the device layer having different thicknesses.

In one embodiment, the device region may include first portions 116 with rounded corners and a second portion 118 which is planar. The rounded corners may be referred to as corner rounding. As shown, the isolation region may include divots 181 at the interface with the device region. The rounded corners and/or divots result from, for example, forming the STI regions. For example, the rounded corner may be formed during STI liner oxidation. The first portions, for example, may be referred to as active edge portions E of the device region while the second portion may be referred to as the center or active center portion C. The different morphology of the different portions may cause a layer to be formed thereon to have different growth rates. For example, stress effects and surface orientation may contribute to the to be formed layer to have different growth rates. Additional factors contributing to different growth rates may include process related factors, such as gas flow and cleaning.

We have observed, for example, the rounded corners and/or divots cause the edge portion to have a different growth rate than the center portion. In one embodiment, the active edge portions have a different oxidation growth rate than the active center portion. For example, the edge portion has a slower growth rate than the center portion, resulting in an oxygen containing layer, such as silicon oxide, which is thinner at the edge portions than the center portion. This undesirably produces, for example, a gate oxide with a non-uniform thickness, which can negatively affect performance and reliability of the device.

In one embodiment, one or more portions of the device region are provided with a growth rate modifier (GRM). The GRM affects the rate of formation of a layer. In one embodiment, the GRM affects oxidation growth rate of a layer. For example, the GRM affects the growth rate of an oxygen containing layer. In one embodiment, the GRM affects the growth rate of a thermally oxidized layer. For example, the GRM affects growth rate of a thermal oxide, such as silicon oxide. The GRM may also be employed to affect the growth rate of other types of thermally oxidized layers. The GRM can either increase or decrease the rate of growth of a thermally oxidized layer as compared to that without a GRM. For example, the GRM can increase or decrease the growth rate of thermal oxide layer. In one embodiment, the GRM comprises a doped GRM. For example, the doped GRM may be a doped region on which a thermally oxidized layer is formed. For example, the doped GRM may be a doped region disposed on a substrate. Providing the GRM in other portions of the device may also be useful.

The dopant type and concentration of the doped GRM can be tailored to achieve the desired growth rate. For example, the GRM may include a growth enhancing (GE) dopant to form GE GRM which increases the growth rate of the thermally oxidized layer. On the other hand, the GRM may include growth retarding dopants (GR) to form a GR GRM to decrease the growth rate of the thermally oxidized layer. GR dopants may comprise nitrogen ions ($N_{14}^+$) and GE dopants may comprise fluorine ions ($F^+$). Other types of GR or GE dopants or combination of GR or GE dopants may also be useful for the GR and GE GRMs. For example, chlorine ions ($Cl^+$) may also serve as GE dopants. The higher the concentration of dopants, the greater the effect on growth rate. For example, a higher concentration of GR dopants will retard the growth rate more than a lower concentration of GR dopants. In the case of GE dopants, a higher concentration will enhance the growth rate greater than a lower concentration of GE dopants. The GRM may affect the growth rate, for example, by up to about 30%. In other embodiments, the GRM may affect growth rate by up to about 15-30%. Affecting the growth rate by other amounts or percentages may also be useful and, for example, may depend on the dopant concentration or dopant type of the GRM. The depth of the GRM may be about 0.1-0.2 µm thick. Other depths may also be useful.

By tailoring the GRM appropriately, the thermally oxidized layer may have the desired growth rates in the different portions of the device region. For example, the different portions of the different device regions may be tuned to produce the desired growth rates. In one embodiment, a device region having different portions with different intrinsic growth rates can be compensated with one or more GRMs to equalize the different growth rates to result in a layer with more uniform thickness. The thickness of the edge and center portions, for example, should be within about 5% of the target thickness. As an example, in the case of a thermal oxide layer having a target thickness of 30 Å, the thickness of the thermal oxide layer at the edge and center portions of the device region on the substrate may be controlled to within +/−1 Å.

In one embodiment, a GRM 131 is disposed in the center portion of the device region. The GRM comprises GR GRM. The GR GRM includes GR dopants to retard the growth of a thermally oxidized layer. In one embodiment the GR GRM retards the growth of a thermally oxidized layer. In one embodiment, the GR GRM retards the growth of a thermal silicon oxide layer. Providing a GR GRM which retards the growth of other types of thermally oxidized layer may also be useful. The GR dopants, in one embodiment, comprise nitrogen ions ($N_{14}^+$). Other types of dopant ions or combination of dopant ions which retard growth rate of a thermally oxidized layer may also be useful. The dopant concentration of the GR GRM may be about 1e19-1e20 atoms/cm³. Other GR dopant concentrations for the GR GRM may also be useful.

The GR GRM retards the growth rate of the thermally oxidized layer in the center portion. In one embodiment, the GR GRM slows the growth rate of the oxide in the center portion. For example, the growth rate of the oxide layer in the center portion is slowed to a rate equal to about the growth rate of oxide at the edge portions. This produces an oxide layer having a more uniform thickness. In one embodiment, the thickness of the oxide layer at the edge and center portions is about the same. The thickness of the edge and center portions, for example, should be within about 5% of the target thickness. As an example, in the case of a thermal oxide layer having a target thickness of 30 Å, the thickness of the thermal oxide layer at the edge and center portions of the device region on the substrate may be controlled to within +/−1 Å.

The oxide layer 150, for example, serves as a gate dielectric layer of a transistor. For example, a gate electrode may be provided over the gate dielectric layer and source/drain regions in the device region adjacent to the gate. As shown, the cross-sectional view is along the direction of the width of a channel of the transistor.

FIG. 1b shows another embodiment of a portion of a device 100. The portion of the device shown includes similar elements as that described in FIG. 1a. As such, the common features need not be discussed. As shown, a GE GRM 133 comprising GE dopants to enhance the growth is provided. In one embodiment, GE GRMs are disposed at the edge portions of the device region. The GE GRMs comprise GE dopants to enhance the growth rate. The GE dopants, in one embodiment, comprise $F^+$ ions. Other types of dopant ions, such as $Cl^+$, or combinations of different dopant ions which enhance oxidation growth rate may also be useful. The dopant concentration of the GE GRM may be about 1e20-1e21 atoms/$cm^3$. Other GE dopant concentrations for the GE GRM may also be useful.

The GE GRM enhances the growth rate of thermally oxidized layer at the edge portion. In one embodiment, the GE GRM increases the growth rate of the thermally oxidized layer in the edge portion to a rate equal to about the growth rate of that in the center portion. This produces, for example, an oxide layer having a more uniform thickness. The thickness of the oxide layer at the edge and center portions is about the same. For example, the thickness of the edge and center portions should be within about 5%. As an example, in the case of a thermal oxide layer having a target thickness of 30 Å, the thickness of the thermal oxide layer at the edge and center portions of the device region on the substrate may be controlled to within +/−1 Å.

The oxide layer, for example, serves as a gate dielectric layer of a transistor. For example, a gate electrode may be provided over the gate dielectric layer and source/drain regions in the device region adjacent to the gate. As shown, the cross-sectional view is along the direction of the width of a channel of the transistor.

FIG. 1c shows yet another embodiment of a portion of a device 100. The portion of the device shown includes similar elements as that described in FIGS. 1a-b. As such, the common features need not be discussed. As shown, the device includes first and second GRMs 131 and 133. The first GRM comprises a GR GRM, as described in FIG. 1a, disposed in the center portion of the device region while the second GRM comprises GE GRMs disposed at the edge portions of the device region, as described in FIG. 1b. The GR GRM includes GR dopants to retard the growth of oxide. The GR dopants, in one embodiment, comprise nitrogen $N_{14}^+$ ions. Other types of dopant ions or combination of dopant ions which retard oxide growth may also be useful. The GE GRMs include GE dopants to enhance the growth rate of a thermally oxidized layer. The GE dopants, in one embodiment, comprise $F^+$ ions. Other types of dopant ions, such as $Cl^+$ or combinations of dopant ions which increase oxidation growth rate may also be useful.

The GE and GR GRMs are tailored to produce growth rates at the edge and center portions which are about the same. For example, the growth rates of a thermally oxidized layer at the edge and center portions are within about 5%. This produces a thermally oxidized layer having a more uniform thickness. The thickness, for example, of the oxide layer at the edge and center portions is about the same. For example, the thickness of the edge and center portions should be within about 5%. As an example, in the case of a thermal oxide layer having a target thickness of 30 Å, the thickness of the thermal oxide layer at the active edge and center portions of the device region on the substrate may be controlled to within +/−1 Å.

By providing GE and GR GRMs, the greater differential in intrinsic growth rates at different portions, such as the edge and center portions, can be compensated.

The oxide layer, for example, serves as a gate dielectric layer of a transistor. For example, a gate electrode may be provided over the gate dielectric layer and source/drain regions in the device region adjacent to the gate. As shown, the cross-sectional view is along the direction of the width of a channel of the transistor.

Figure 2A:
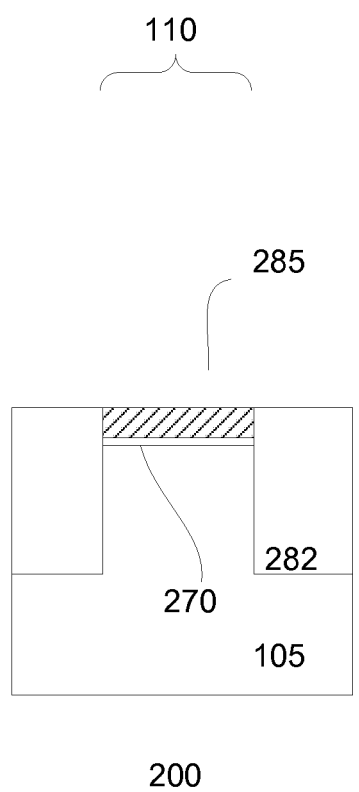
FIGS. 2a-f show a process of forming an embodiment of a device.

FIGS. 2a-f show cross-sectional views of a process 200 of forming an embodiment of a device or IC. Referring to FIG. 2a, a substrate 105 is provided. The substrate can comprise a silicon substrate, such as a lightly doped p-type substrate. Other types of substrates, including silicon germanium or silicon-on-insulator (SOI), are also useful. A device region 110 is defined on the substrate. Although one device region is shown, it is however understood that the substrate may include various types of regions (not shown). The device region is separated from other regions by an isolation region 282. The isolation region, for example, is an inactive region on the substrate and surrounds the device region.

The isolation region is, for example, a STI. The depth of the STI may be, for example, about 2000-4500 Å. Other depths for the STI may also be useful. The STI, as shown, is partially formed and comprises a top surface which is coplanar with a top surface of a stop layer 285 used in forming the STI. The stop layer, for example, serves as a chemical mechanical polishing (CMP) stop layer used in forming the STI. For example, excess dielectric fill material of the STI above CMP stop layer may be removed by CMP to form the coplanar top surfaces. The CMP stop layer, for example, comprises silicon nitride. The stop layer mask may also be formed from other types of materials. A pad layer 270 may be provided below the hard mask. The pad layer may be silicon oxide. The pad layer facilitates adhesion of the CMP stop layer.

Figure 2B:
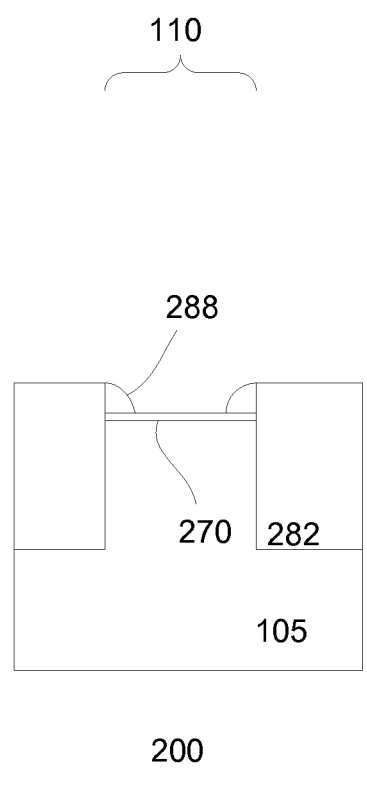

Referring to FIG. 2b, the CMP stop layer is removed. As shown, the CMP stop layer is removed, leaving the pad layer and a portion of the STI protruding above the substrate. Removal of the CMP stop layer may be achieved by an etch. The etch may be an isotropic etch, such as a wet etch. The etch, for example, removes the material of the CMP stop layer selective to the pad and isolation materials. This removes the CMP stop layer, leaving the pad layer and isolation region. Other techniques for selectively removing the CMP stop layer may also be useful. For example, an isotropic dry etch, may be employed to selectively remove the CMP stop layer.

In one embodiment, dummy or disposable spacers 288 are formed on sides of the isolation region exposed by the removal of the mask. The dummy spacers are formed from, for example, a dielectric material. Other types of materials may also be useful. In one embodiment, the material of the dummy spacers can be selectively removed with respect to the pad layer and isolation regions and vice-versa. In one embodiment, the dummy spacers are formed from silicon nitride.

To form the dummy spacers, a spacer layer is deposited on the substrate. The dummy spacer layer should be formed from a material which can be selectively removed from the STI and pad material. The spacer layer may comprise silicon nitride. The spacer layer may be formed by, for example, chemical vapor deposition (CVD). Other types of processes or materials may also be used to form the spacer layer. The thickness of the spacer layer is roughly equal to about the width of the spacers. An anisotropic etch, such as RIE, is performed to remove horizontal portions of the spacer layer, leaving the dummy spacers on exposed sides of the isolation region.

The width of the spacers should be sufficient to facilitate formation of the GRM in the device region. In one embodiment, the width of the spacers should be sufficient to facilitate formation of a GR GRM which produces a thermally oxidized layer having about a uniform thickness. The width of the spacers may be determined by, for example, thinner factor of the thermally oxidized layer at the active edge. The width of the spacers should expose the active center of the device region which has a faster growth than the active edge. For example, the spacers expose the active center portion while protecting the active edge portions. In some embodiments, the spacers may protect the outer periphery of the active center to allow for some lateral diffusion of the GR doponts. In other embodiments, spacers may be annealed to reflow the spacer material to increase the width of the spacers.

Figure 2C:
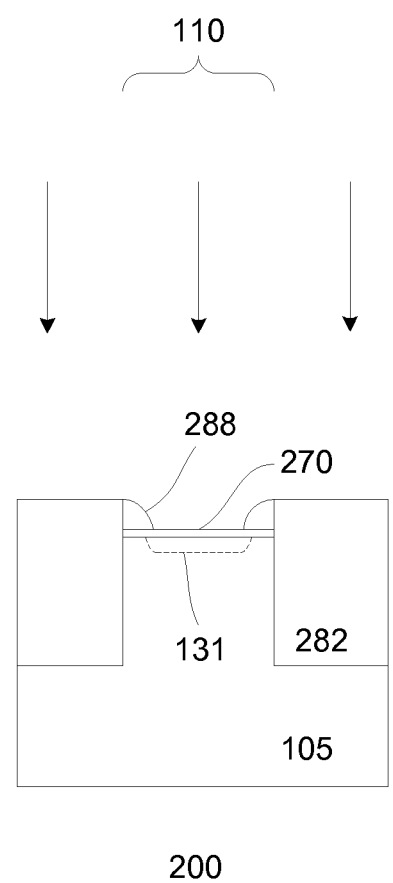

In FIG. 2c, dopant ions are implanted into the substrate to form a GRM 131. In one embodiment, GR dopants are implanted to form a GR GRM. The implant, for example, may be self-aligned to the exposed center portion of the device region and the dummy spacers. This avoids the need for an additional mask to form the GRM. In other embodiments, an implant mask may be used to mask regions of the substrate which are not to be implanted.

Figure 2D:
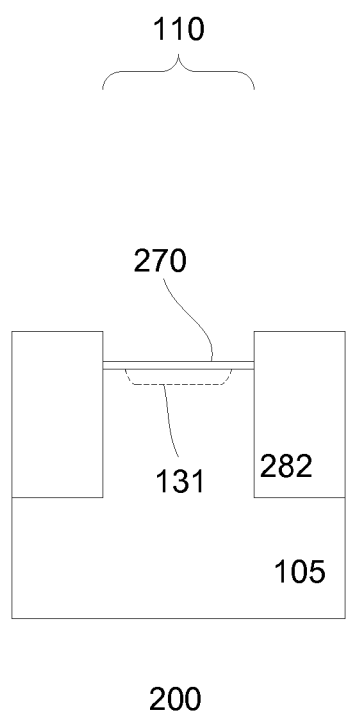

As shown in FIG. 2d, the dummy spacers are removed. Removal of the dummy spacers may be performed by, for example, an isotropic etch. The isotropic etch, for example, may be a wet etch. Other types of etch processes, such as a dry isotropic etch, may also be useful. The etch, for example, removes the spacer material selective to the pad and isolation materials. This removes the spacers, leaving the pad layer and isolation region. Other techniques for removing the spacers may also be useful.

A doped transistor well (not shown) may be formed in the device region. The transistor well may be formed by implanting dopants into the device region. In one embodiment, second polarity type dopants are implanted into the device region of the substrate. The second polarity type doped well is used for a first polarity type transistor. For example, a p-type transistor well is used for a n-type transistor.

An implant mask may be used to mask regions of the substrate which are not to be implanted. For example, the implant mask protects second type device regions while exposing the first type device regions. The implant mask, for example, comprises photoresist patterned by a lithographic mask. The implant mask may be removed after the transistor well is formed.

Figure 2E:
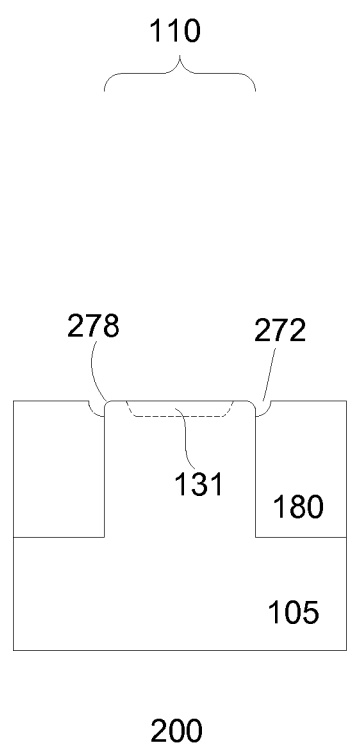

In FIG. 2e, the process continues to complete forming the isolation region. For example, a clean process is performed to reduce the height of the STI. The clean process, for example, comprises a wet etch. Other types of clean processes may also be useful. The clean process may produce a substantially planar surface between the STI and the substrate. In other embodiments, the surface of the STI may be above or slightly above the substrate. For example, the surface of the STI may be 100-200 Å above the substrate surface. Providing the top surface having other heights may also be useful. The clean process may form divots 272. For example, divots may be formed in the isolation region at the interface of the device and isolation regions. The device region may also include rounded corners 278. The rounded corners may be formed during STI liner oxidation (not shown).

Figure 2F:
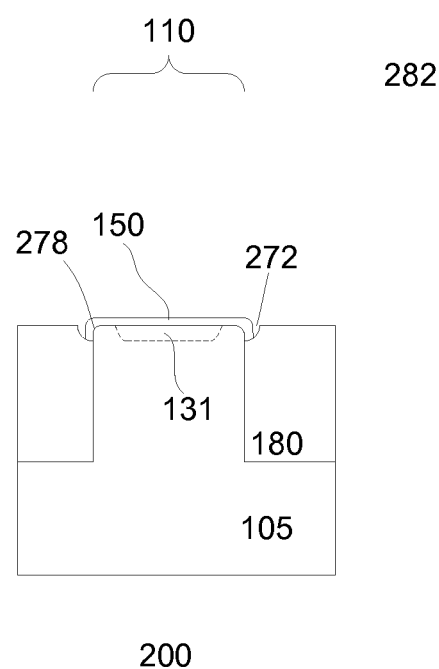

A dielectric layer 150 may be formed on the device region, as shown in FIG. 2f. The dielectric layer, in one embodiment, is formed by a thermal process. The thermal process selectively forms a thermally oxidized layer on exposed surfaces of the substrate, such as the active device region. The thermal process, in one embodiment, forms a thermal silicon oxide layer on active device region. Forming other types of thermally oxidized layers, such as silicon oxynitride, may also be useful.

In one embodiment, the GR GRM retards the growth rate of thermally oxidized layer in the active center portion. In one embodiment, the GRM slows the growth rate of the thermally oxidized layer, such as silicon oxide, in the active center portion to a rate equal to about the growth rate of that at the active edge portions. This produces, for example, an oxide layer having a more uniform thickness. The thickness of the oxide layer at the active edge and active center portions is about the same. For example, the thickness of the edge and center portions should be within about 5% of the target thickness.

The oxide layer, for example, serves as a gate oxide of a transistor. As shown, the cross-sectional view is along the direction of the width of a channel of the transistor. The process may continue to, for example, form a gate electrode layer, patterning the gate electrode and gate dielectric layer to form a gate stack, forming source/drain regions in the device region adjacent to gate. Additional processes may include forming silicide contacts on the various contact regions, such as gate and source/drain regions, an ILD layer and contacts to the contact regions, one or more interconnect levels, final passivation, dicing, assembly and packaging. Other processes are also useful. For example, other components, such as low voltage, medium voltage, and high voltage I/O devices can be formed prior to forming the interconnections.

Figure 3A:
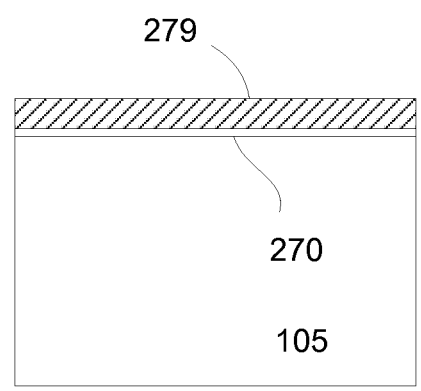
FIGS. 3a-f show a process of forming another embodiment of a device.

FIGS. 3a-f show cross-sectional views of a process 300 of forming another embodiment of a device or IC. Referring to FIG. 3a, a substrate 105 is provided. The substrate can comprise a silicon substrate, such as a lightly doped p-type substrate. Other types of substrates are also useful.

The substrate is prepared with a CMP stop layer 279. The CMP stop layer is used to, for example, form a STI region. In one embodiment, the CMP stop layer comprises silicon nitride. The CMP stop layer may be formed by, for example, CVD. Other deposition techniques or CMP stop materials may also be used. A pad layer 270 may be provided below the hard mask layer. The pad layer facilitates adhesion of the hard mask layer to the substrate. The pad layer, for example, comprises silicon oxide. The pad layer may be formed by a thermal process, such as thermal oxidation. Other deposition techniques or mask materials may also be useful.

Figure 3B:
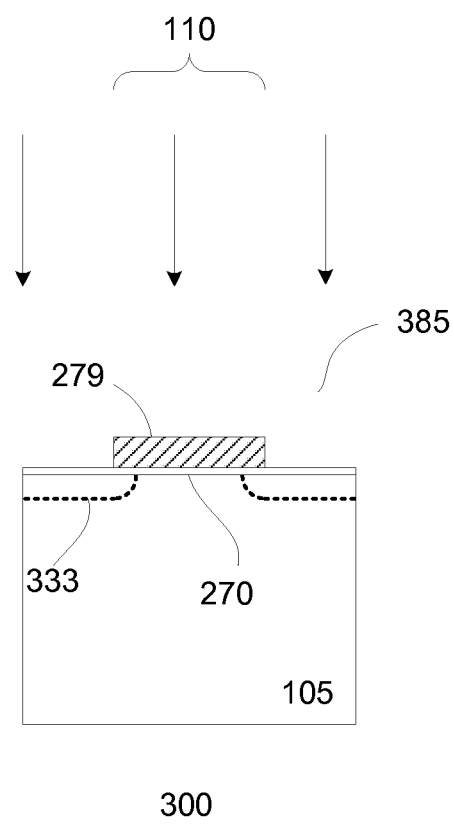

As shown in FIG. 3b, the CMP stop layer is patterned to form an opening 385. The opening, for example, corresponds to the non-active region in which an isolation region is to be formed. The portion of the CMP stop layer covering the substrate corresponds to the active device region 110 in which a transistor will be formed. The CMP stop layer may be patterned using, for example, a patterned photoresist mask (not shown). The photoresist mask is patterned by, for example, exposing the photoresist mask with a radiation source through a lithographic mask having the desired pattern. The photoresist mask is then developed to remove the exposed or unexposed portions, depending on whether a positive or negative photoresist is used. To increase imaging resolution, an anti-reflective coating (ARC) may be provided below the photoresist. The pattern of the photoresist mask is then transferred to the CMP stop layer by, for example, an anisotropic etch, such as RIE.

In one embodiment, GRMs are formed in the device region. The GRMs are formed by implanting dopants into the device region of the substrate. In one embodiment, GE dopants are implanted into the substrate to form GE GRMs 333. The photoresist mask patterning the CMP stop layer may be used as an implant mask for implanting GE dopants to form the GE GRMs. This avoids the need for an additional mask to form the GE GRM. The dopant profile of the GE GRMs extends from the inactive region to the active region. In one embodiment, the dopant profile of the GE GRMs extends into active edge portions of the active device region beneath the implant mask.

To achieve the desired dopant profile, tilted implants may be performed to extend the dopants into the active edge portions. The tilted implant can control the dopant profile of the GE GRMs under the active edge portions. In other embodiments, an anneal may be performed to diffuse the dopants into the active edge portions. Performing a combination of tilted implants and an anneal may also be useful to achieve the desired dopant profile for the GE GRMs.

Figure 3C:
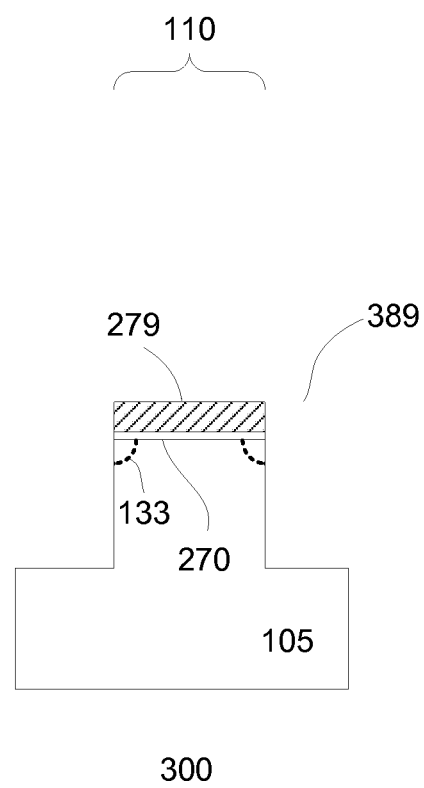

Referring to FIG. 3c, the substrate is etched using the photoresist mask to form an isolation trench 389. In one embodiment, the substrate is etched using an anisotropic etch, such as RIE. Forming the trench forms GE GRMs 133 in the active edge portions of the device region. The depth of the trenches may be, for example, about 2000-4500 Å. Other trench depths may also be useful.

Figure 3D:
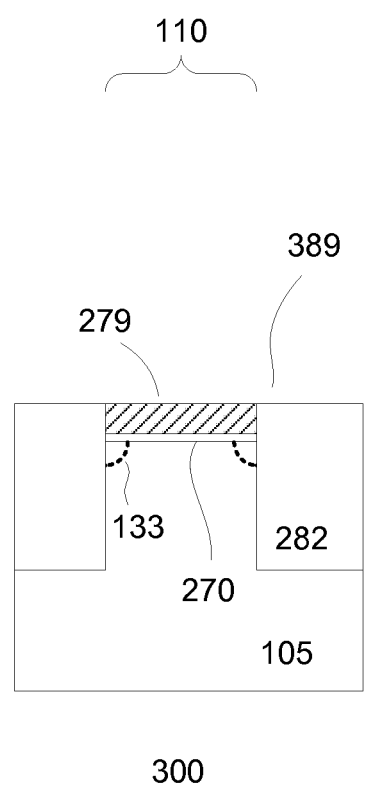

In FIG. 3d, the isolation trench is filled with an isolation material. For example, the isolation trench is filled with silicon oxide. Other types of trench fill materials may also be used. The trench fill material may be formed by CVD. Other techniques or materials may also be used to fill the trenches. A planarizing process may be performed to remove excess trench fill material, leaving a planar top surface. As shown, the planarizing process produces a planar top surface with the hard mask and dielectric fill material of the STI trenches. In one embodiment, the planarizing process may comprise CMP. Other types of planarizing processes may also be used.

The CMP stop layer may be removed. A doped transistor well (not shown) may be formed in the device region. The transistor well may be formed by implanting dopants into the device region. In one embodiment, second polarity type dopants are implanted into the device region of the substrate. The second polarity type doped well is used for a first polarity type transistor. For example, a p-type transistor well is used for a n-type transistor. In other embodiments, the transistor well may be formed prior to forming the STI.

Figure 3E:
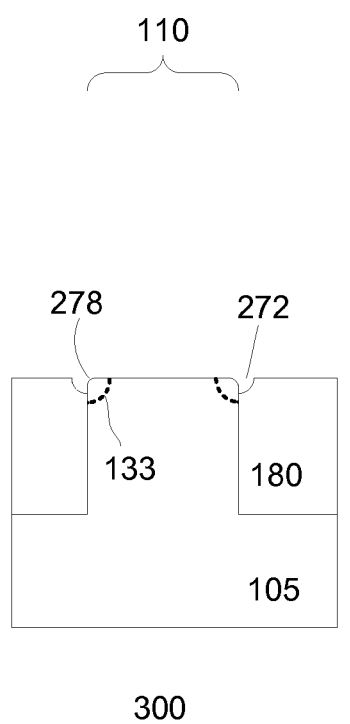

In FIG. 3e, the process continues to complete forming the isolation region. For example, a clean process is performed to reduce the height of the STI. The clean process, for example, comprises a wet etch. Other types of clean processes may also be useful. The clean process produces a substantially planar surface between the STI and the substrate. The clean process may form divots 272. For example, divots may be formed in the isolation region at the interface of the device and isolation regions. The device region may also include rounded corners 278. The rounded corners may be formed during STI liner oxidation (not shown).

Figure 3F:
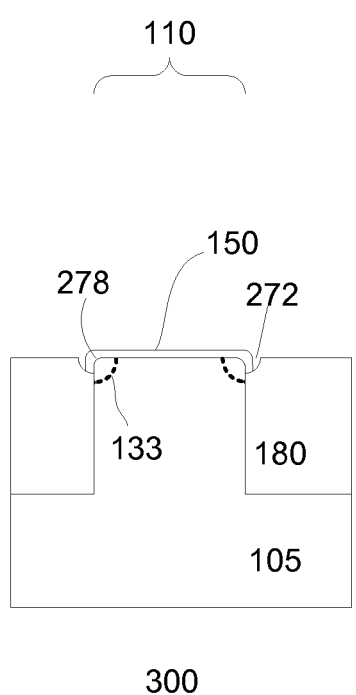

A dielectric layer 150 may be formed on the device region, as shown in FIG. 3f. The dielectric layer, in one embodiment, is formed by a thermal process. The thermal process selectively forms a thermally oxidized layer on exposed surfaces of the substrate, such as the active device region. The thermal process, in one embodiment, forms a thermal silicon oxide layer on active device region. Forming other types of thermally oxidized layers, such as silicon oxynitride, may also be useful.

In one embodiment, the GE GRMs enhance the growth rate of thermally oxidized layer in the active edge portions. In one embodiment, the GRMs enhance the growth rate of the thermally oxidized layer, such as silicon oxide, in the active edge portions to a rate equal to about the growth rate of that at the active center portion. This produces, for example, an oxide layer having a more uniform thickness. The thickness of the oxide layer at the active edge and active center portions is about the same. For example, the thickness of the edge and center portions should be within about 5% of the target thickness.

The oxide layer, for example, serves as a gate oxide of a transistor. As shown, the cross-sectional view is along the direction of the width of a channel of the transistor. The process may continue to, for example, form a gate electrode layer, patterning the gate electrode and gate dielectric layer to form a gate stack, forming source/drain regions in the device region adjacent to the gate. Additional processes may include forming silicide contacts on the various contact regions, such as gate and source/drain regions, an ILD layer and contacts to the contact regions, one or more interconnect levels, final passivation, dicing, assembly and packaging. Other processes are also useful. For example, other components, such as low voltage, medium voltage, and high voltage I/O devices can be formed prior to forming the interconnections.

Figure 4A:
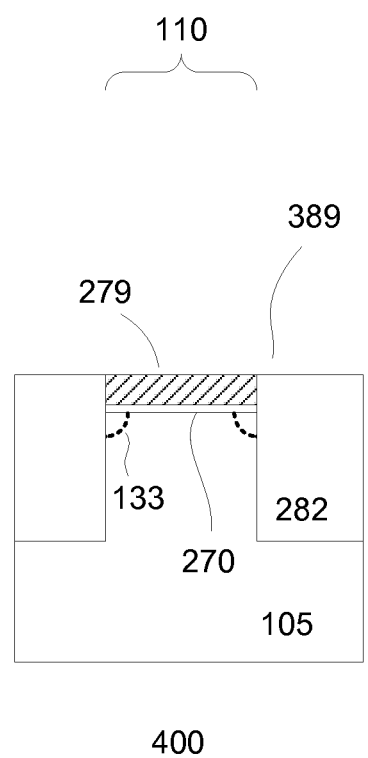
FIGS. 4a-c show a process of forming yet another embodiment of a device.
Figure 4B:
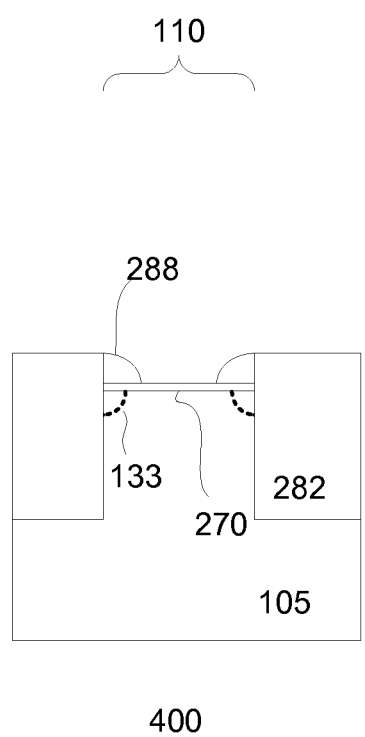
Figure 4C:
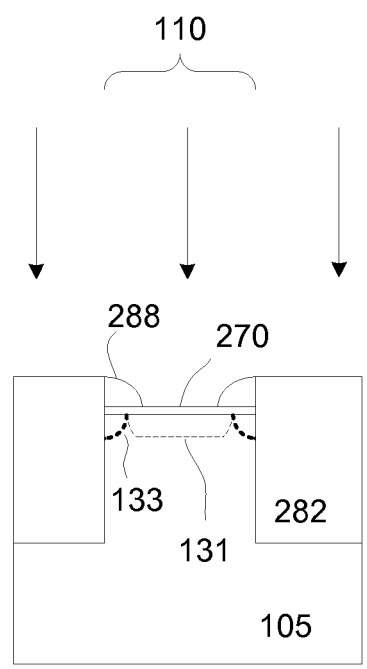

FIGS. 4a-c show cross-sectional views of a process 400 of forming an embodiment of a device or IC. Referring to FIG. 4a, a substrate 105 is provided. The substrate can comprise a silicon substrate, such as a lightly doped p-type substrate. Other types of substrates are also useful. The substrate, as shown, is at a stage of processing as described in FIG. 3d. As such, the common features need not be discussed. For example, the substrate is prepared with a partially formed isolation region 282 formed in a trench 389. The isolation region has a top surface which is coplanar with a top surface of a CMP stop layer 279. A pad layer 270 may be disposed beneath the CMP stop layer. In FIG. 3d, the isolation trench is filled with an isolation material. At active edge portions of the device region 110 are GE GRMs 133.

Referring to FIG. 4b, the CMP stop layer is removed. As shown, the CMP stop layer is removed, leaving the pad layer recentering and a portion of the STI protruding above the substrate. Removal of the CMP stop layer may be achieved by an etch. The etch may be an isotropic etch, such as a wet etch. The etch, for example, removes the CMP stop material selective to the pad and isolation materials. This removes the mask, leaving the pad layer and isolation region. Other techniques for removing the CMP stop layer, such as a dry isotropic etch, may also be useful.

In one embodiment, dummy or disposable spacers 288 are formed on sides of the isolation region exposed by the removal of the mask. The dummy spacers are formed from, for example, a dielectric material. Other types of materials may also be useful. In one embodiment, the material of the dummy spacers can be selectively removed with respect to the pad layer and isolation regions and vice-versa. In one embodiment, the dummy spacers are formed from silicon nitride.

To form the dummy spacers, a spacer layer is deposited on the substrate. The dummy spacer layer should be formed from a material which can be selectively removed from the STI and pad material. The spacer layer may comprise silicon nitride. The spacer layer may be formed by, for example, chemical vapor deposition (CVD). Other types of processes or materials may also be used to form the spacer layer. The thickness of the spacer layer is roughly equal to about the width of the spacers. An anisotropic etch, such as RIE, is performed to remove horizontal portions of the spacer layer, leaving the dummy spacers on exposed sides of the isolation region.

The width of the spacers should be sufficient to facilitate formation of the GRM in the device region. In one embodiment, the width of the spacers should be sufficient to facilitate formation of a GR GRM which produces a thermally oxidized layer having about a uniform thickness. The width of the spacers may be determined by, for example, thinner factor of the thermally oxidized layer at the active edge. The width of the spacers should expose the active center of the device region which has a faster growth rate than the active edge. For example, the spacers expose the active center portion while protecting the active edge portions. In some embodiments, the spacers may protect the outer periphery of the active center to allow for some lateral diffusion of the GR dopants. In other embodiments, spacers may be annealed to reflow the spacer material to increase the width of the spacers.

In FIG. 4c, dopant ions are implanted into the substrate to form a GRM 131. In one embodiment, GR dopants are implanted to form a GR GRM. The implant, for example, may be self-aligned to the exposed center portion of the device region and the dummy spacers. This avoids the need for an additional mask to form the GRM. In other embodiments, an implant mask may be used to mask regions of the substrate which are not to be implanted.

The process continues, for example, as described from FIGS. 3d-f to produce an oxide layer having a more uniform thickness. The oxide layer, for example, serves as a gate oxide of a transistor. As shown, the cross-sectional view is along the direction of the width of a channel of the transistor. The process may continue to, for example, form a gate electrode layer, patterning the gate electrode and gate dielectric layer to form a gate stack, forming source/drain regions in the device region adjacent to gate. Additional processes may include forming silicide contacts on the various contact regions, such as gate and source/drain regions, a PMD layer and contacts to the contact regions, one or more interconnect levels, final passivation, dicing, assembly and packaging. Other processes are also useful. For example, other components, such as low voltage, medium voltage, and high voltage I/O devices can be formed prior to forming the interconnections.

Figure 5A:
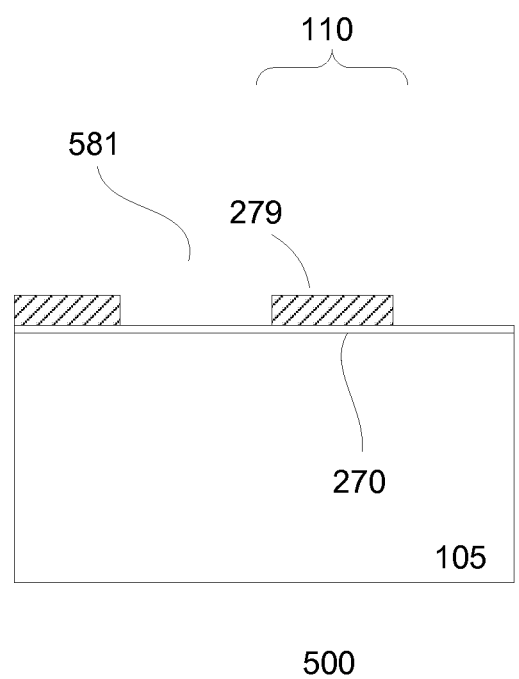
FIGS. 5a-g show another embodiment of forming an embodiment of a device.

FIGS. 5a-g show cross-sectional views of a process 500 for forming another embodiment of a device or IC. Referring to FIG. 5a, a substrate 105 is provided. The substrate can comprise a silicon substrate, such as a lightly doped p-type substrate. Other types of substrates are also useful.

The substrate is prepared with a CMP stop layer 279. The CMP stop layer is used to, for example, form a STI region. In one embodiment, the CMP stop layer comprises silicon nitride. The CMP stop layer may be formed by, for example, CVD. Other deposition techniques or CMP stop materials may also be used. A pad layer 270 may be provided below the hard mask layer. The pad layer facilitates adhesion of the hard mask layer to the substrate. The pad layer, for example, comprises silicon oxide. The pad layer may be formed by a thermal process, such as thermal oxidation. Other deposition techniques or mask materials may also be useful.

The CMP stop layer is patterned to form an opening 581. The opening, for example, substantially corresponds to the non-active region in which an isolation region is to be formed. The portion of the CMP stop layer covering the substrate substantially corresponds to the active device region 110 in which a transistor will be formed. The CMP stop layer may be patterned using for example, a patterned photoresist mask (not shown). The photoresist mask is patterned by, for example, exposing the photoresist mask with a radiation source through a lithographic mask having the desired pattern. The photoresist mask is then developed to remove the exposed or unexposed portions, depending on whether a positive or negative photoresist is used. To increase imaging resolution, an anti-reflective coating (ARC) may be provided below the photoresist. The pattern of the photoresist mask is then transferred to the CMP stop layer by, for example, an anisotropic etch, such as RIE.

In one embodiment, the CMP stop layer is patterned such that the opening is larger than the isolation region. The amount that the opening is increased should be sufficient to facilitate formation of a GRM in the device region. In one embodiment, the amount should be sufficient to facilitate formation of a GE GRM which produces a thermally oxidized layer having about a uniform thickness. The amount by which the opening is larger may be determined by, for example, thinner factor of the thermally oxidized layer at the active edge. In one embodiment, the CMP stop layer covers the active center portion of the device region while exposing the active edge portions. In some embodiment, the CMP stop layer may be patterned to be larger to cover a part of the active edge portions to allow for lateral diffusion of GE dopants of a subsequently formed GE GRM.

Figure 5B:
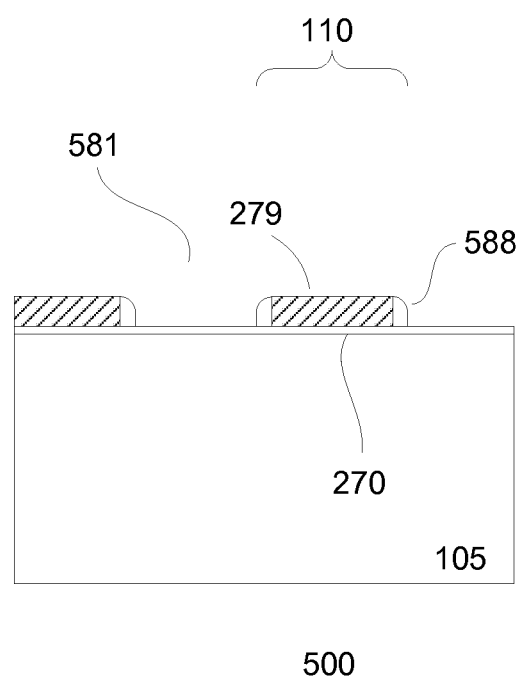

In FIG. 5b, dummy or disposable spacers 588 are formed on sides of CMP stop layer. The dummy spacers are formed from, for example, a dielectric material. Other types of materials may also be useful. In one embodiment, the material of the dummy spacers can be selectively removed with respect to the CMP stop layer, pad layer and isolation regions. The dummy spacers, for example, may comprise polysilicon. To form the dummy spacers, a spacer layer is deposited on the substrate. The spacer layer may be formed by, for example, chemical vapor deposition (CVD). Other types of processes or materials may also be used to form the spacer layer. The thickness of the spacer layer is roughly equal to about the width of the spacers. The width of the spacer should result in an opening equal to about the size of the STI opening. An anisotropic etch, such as RIE, is performed to remove horizontal portions of the spacer layer, leaving the dummy spacers on exposed sides of the CMP stop layer.

Figure 5C:
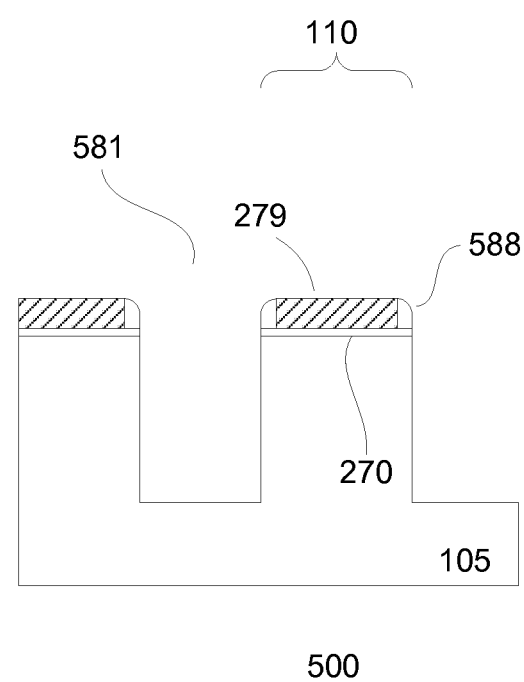

Referring to FIG. 5c, the substrate is etched using the CMP stop and dummy spacers as an etch mask to form an isolation trench 581. The trench, for example, surrounds the active device region. In one embodiment, the substrate is etched using an anisotropic etch, such as RIE. The depth of the trenches may be, for example, about 2000-4500 Å. Other trench depths may also be useful.

Figure 5D:
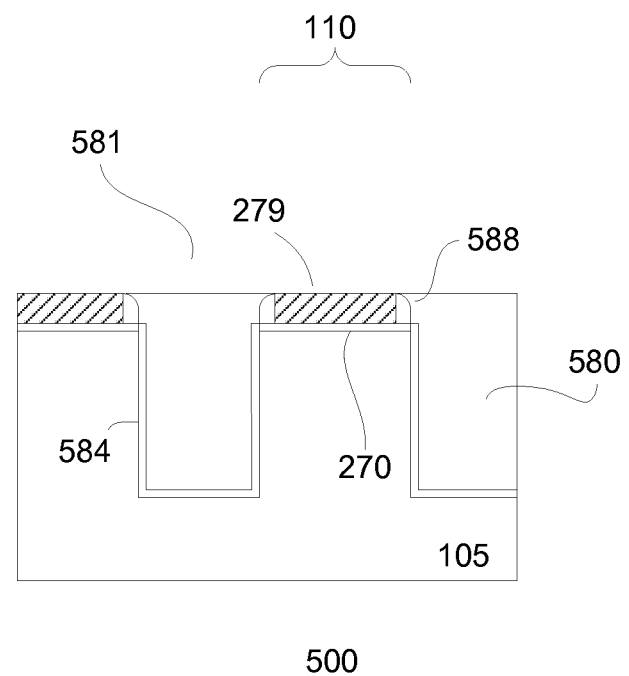

In FIG. 5d, the isolation trench may be filled with a dielectric liner 584, covering the sidewalls and bottom of the trench. The dielectric liner, for example, is formed by an oxidation process. The isolation trench is filled with an isolation material. For example, the isolation trench is filled with silicon oxide. Other types of trench fill materials may also be used. The trench fill material may be formed by CVD. Other techniques or materials may also be used to fill the trenches. In one embodiment, an anneal may be performed. A planarizing process may be performed to remove excess trench fill material, leaving a planar top surface. As shown, the planarizing process produces a planar top surface with the hard mask and dielectric fill material of the STI trenches. In one embodiment, the planarizing process may comprise CMP. Other types of planarizing processes may also be used.

In one embodiment, the STI may be pull backed by, for example, an isotropic etch, such as a wet etch. The pull back reduces the height of the STI to below the CMP stop layer. Other techniques for pulling back the STI may also be useful.

Figure 5E:
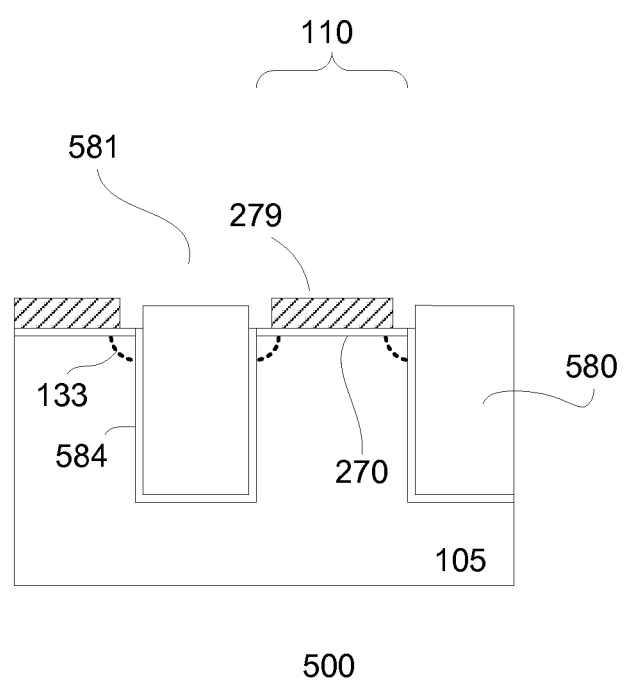

In FIG. 5e, the dummy spacers are removed selective to the CMP stop layer, the STI and the pad layer. This provides an opening above the active edge portions of the active device region. Dopant ions are implanted into the substrate to form GE GRMs 133. In one embodiment, GE dopants are implanted to form GE GRMs. The implant, for example, may be self-aligned to the exposed active edge portions in the device region due to removal of the dummy spacers. This avoids the need for an additional mask to form the GRM. In other embodiments, an implant mask may be used to mask regions of the substrate which are not to be implanted.

As described, the GE dopants are implanted after the STI is formed. This may avoid STI related thermal processes. This may eliminate possible GE dopants diffusion associated with the thermal budget associated with the STI formation. As a result, the as-implanted GE profile may be better maintained due to reduced exposure of thermal processes.

The CMP stop layer may be removed. A doped transistor well (not shown) may be formed in the device region. The transistor well may be formed by implanting dopants into the device region. In one embodiment, second polarity type dopants are implanted into the device region of the substrate. The second polarity type doped well is used for a first polarity type transistor. For example, a p-type transistor well is used for a n-type transistor. In other embodiments, the transistor well may be formed prior to forming the STI.

Figure 5F:
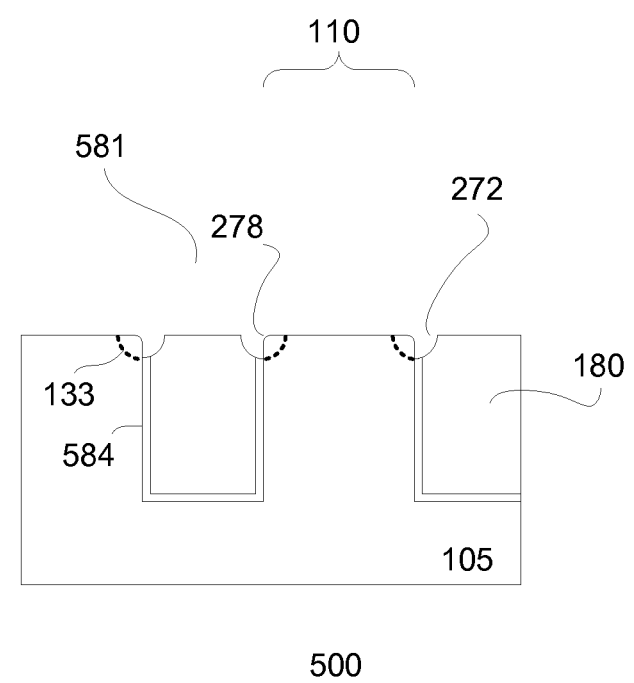

In FIG. 5f, the process continues to complete forming the isolation region. For example, a clean process is performed to reduce the height of the STI. The clean process, for example, comprises a wet etch. Other types of clean processes may also be useful. The clean process produces a substantially planar surface between the STI and the substrate. The clean process may form divots 272. For example, divots may be formed in the isolation region at the interface of the device and isolation regions. The device region may also include rounded corners 278. The rounded corners may be formed during STI liner oxidation (not shown).

Figure 5G:
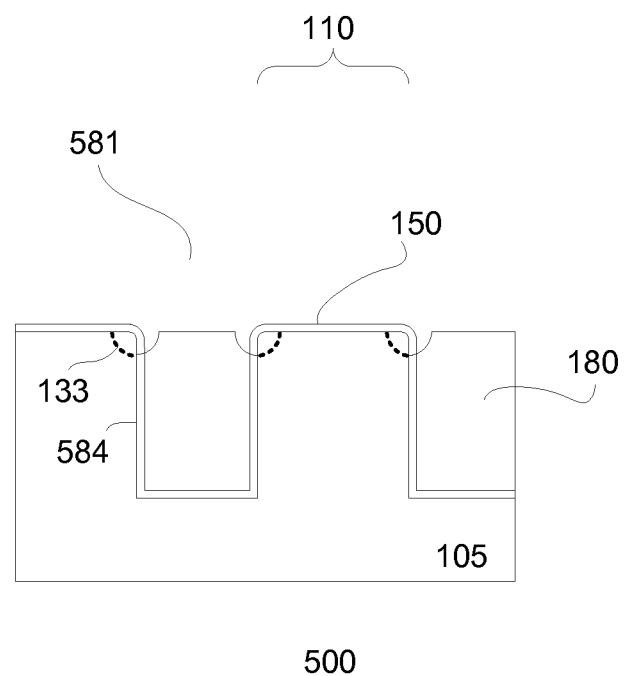

A dielectric layer 150 may be formed on the device region, as shown in FIG. 5g. The dielectric layer, in one embodiment, is formed by a thermal process. The thermal process selectively forms a thermally oxidized layer on exposed surfaces of the substrate, such as the active device region. The thermal process, in one embodiment, forms a thermal silicon oxide layer on active device region. Forming other types of thermally oxidized layers, such as silicon oxynitride, may also be useful.

In one embodiment, the GE GRMs enhance the growth rate of thermally oxidized layer in the active edge portions. In one embodiment, the GRMs enhance the growth rate of the thermally oxidized layer, such as silicon oxide, in the active edge portions to a rate equal to about the growth rate of that at the active center portion. This produces, for example, an oxide layer having a more uniform thickness. The thickness of the oxide layer at the active edge and active center portions is about the same. For example, the thickness of the edge and center portions should be within about 5% of the target thickness.

The oxide layer, for example, serves as a gate oxide of a transistor. As shown, the cross-sectional view is along the direction of the width of a channel of the transistor. The process may continue to, for example, form a gate electrode layer, patterning the gate electrode and gate dielectric layer to form a gate stack, forming source/drain regions in the device region adjacent to gate. Additional processes may include forming silicide contacts on the various contact regions, such as gate and source/drain regions, an ILD layer and contacts to the contact regions, one or more interconnect levels, final passivation, dicing, assembly and packaging. Other processes are also useful. For example, other components, such as low voltage, medium voltage, and high voltage I/O devices can be formed prior to forming the interconnections.

In other embodiments, the one or more GRMs may be provided within a device region surrounded by an STI. The one or more GRMs may be used to provide a device layer having different thicknesses. For example, the one or more GRMs may be used to used to provide a thermally oxidized layer in different portions of the device region with different thicknesses. In one embodiment, a GRM is provided in a first portion of the device region to provide a thermally oxidized layer having different thicknesses in first and second portions.

In other embodiments, first and second GRMs may be provided in first and second portions of the device region to provide a thermally oxidized layer having different thicknesses in the first and second portions. The first and second GRMs affect the growth rates differently. For example, the first GRM may be a GE GRM while the second GRM may be a GR GRM. In other embodiments, the first and second GRMs may be of the same type, but with different dopant concentrations to affect the growth rate differently. This may be useful for a device region having two transistors having different gate oxide thicknesses. In yet other embodiments, the device region may include more than two portions with more than two transistors having different gate oxide thickness. In such case, two or more GRMs may be provided.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method for forming a semiconductor device comprising:
   providing a substrate with a device region having first and second regions, wherein the first region comprises a first intrinsic growth rate for a device layer and the second region comprises a second intrinsic growth rate for the device layer;
   forming a growth rate modifier (GRM) in the first region of the substrate, wherein the GRM modifies the first intrinsic growth rate to a first modified growth rate; and
   forming the device layer on the substrate, wherein the device layer has the first modified growth rate in the first region.

2. The method of claim 1 wherein:
   the first and second intrinsic growth rates are different; and
   the first modified growth rate is about the same as the second intrinsic growth rate.

3. The method of claim 1 wherein:
   the first intrinsic growth rate is slower than the second intrinsic growth rate; and
   the GRM enhances the first intrinsic growth rate to produce the first modified growth rate which is faster than the first intrinsic growth rate.

4. The method of claim 3 wherein the GRM comprises a doped GRM with growth rate enhancing (GE) dopants.

5. The method of claim 1 wherein:
   the first intrinsic growth rate is faster than the second intrinsic growth rate; and
   the GRM retards the first intrinsic growth rate to produce the first modified growth rate which is slower than the first intrinsic growth rate.

6. The method of claim 5 wherein the GRM comprises a doped GRM with growth rate retarding (GR) dopants.

7. The method of claim 1 wherein:
   the first region comprises active edge portions of an active device region; and
   the second region comprises active center portion of the active device region.

8. The method of claim 7 wherein the first intrinsic growth rate of the active edge portions is slower than the second intrinsic growth rate of the active center portion.

9. The method of claim 8 wherein the GRM is formed in the active edge portions to enhance the first intrinsic growth rate to produce the first modified growth rate which is faster than the first intrinsic growth rate.

10. The method of claim 9 wherein the first modified growth rate is about the same as the second intrinsic growth rate.

11. The method of claim 1 wherein:
the first region comprises active center portion of an active device region; and
the second region comprises active edge portions of the active device region.

12. The method of claim 11 wherein the first intrinsic growth rate of the active center portion is faster than the second intrinsic growth rate of the active edge portions.

13. The method of claim 12 wherein the GRM is formed in the active center portion to retard the first intrinsic growth rate to produce the first modified growth rate which is slower than the first intrinsic growth rate.

14. The method of claim 13 wherein the first modified growth rate is about the same as the second intrinsic growth rate.

15. The method of claim 13 further comprises forming second GRMs in the active edge portions to enhance the second intrinsic growth rate to produce a second modified growth rate which is faster than the second intrinsic growth rate.

16. The method of claim 15 wherein the first modified growth rate is about the same as the second modified growth rate.

17. The method of claim 1 wherein forming the device layer comprises thermal oxidation to form a thermally oxidized device layer.

18. The method of claim 17 wherein the thermally oxidized device layer serves as a gate oxide for a transistor in the active device region.

19. The method of claim 1 wherein the GRM causes the device layer to have a first thickness in a first region of the device region and a second thickness in a second device region.

20. A method for forming a semiconductor device comprising:
providing a substrate with an active device region surrounded by an isolation region, the device region having active edge regions and an active center region, the active edge region having a first intrinsic oxidation growth rate and the active center region having a second intrinsic oxidation growth rate which is faster than the first intrinsic oxidation growth rate;
forming a first growth rate modifier (GRM) in either the active edge regions or the active center region to modify the first intrinsic oxidation growth rate or second intrinsic oxidation growth rate to produce a modified first oxidation growth rate or a second modified oxidation growth rate; and
forming an oxygen containing layer by thermal oxidation.

21. A method for forming a semiconductor device comprising:
providing a substrate with an active device region having first and second regions, wherein the first region includes a first growth rate and the second region includes a second growth rate;
forming a growth rate modifier (GRM) in the first region of the substrate, wherein the GRM modifies the first growth rate to a first modified growth rate; and
forming a device layer on the active device region of the substrate, wherein the device layer has the first modified growth rate in the first region.

* * * * *